United States Patent
Zhu et al.

(10) Patent No.: US 8,232,155 B2
(45) Date of Patent: Jul. 31, 2012

(54) STRUCTURE AND METHOD FOR MANUFACTURING DEVICE WITH A V-SHAPE CHANNEL NMOSFET

(75) Inventors: Huilong Zhu, Poughkeepsie, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 13/015,875

(22) Filed: Jan. 28, 2011

(65) Prior Publication Data
US 2011/0124165 A1    May 26, 2011

Related U.S. Application Data

(63) Continuation of application No. 12/488,783, filed on Jun. 22, 2009, now abandoned.

(51) Int. Cl.
*H01L 21/311* (2006.01)
(52) U.S. Cl. ................. 438/199; 257/E21.249
(58) Field of Classification Search ............ 438/199
See application file for complete search history.

(56) References Cited

U.S. PATENT DOCUMENTS

| | | | |
|---|---|---|---|
| 4,364,074 A | 12/1982 | Garnache et al. |
| 4,408,386 A | 10/1983 | Takayashiki et al. |
| 5,571,376 A | 11/1996 | Bestwick et al. |
| 6,252,272 B1 | 6/2001 | Watanabe et al. |
| 6,274,445 B1 | 8/2001 | Nouri |
| 6,670,694 B2 | 12/2003 | Momose |
| 7,045,278 B2 | 5/2006 | Ihara et al. |
| 7,528,027 B1 | 5/2009 | Zhu et al. |
| 2006/0131675 A1 | 6/2006 | Wang et al. |
| 2009/0189199 A1 | 7/2009 | Moriyama et al. |

OTHER PUBLICATIONS

O. Weber, et al, "A Novel Locally Engineered (111) V-channel pMOSFET Architecture with Improved Drivability Characteristics for Low-Standby power (LSTP) CMOS Applications", 2005 Symposium on VLSI Technology Digest of Technical Papers, pp. 156-157.

*Primary Examiner* — Benjamin Sandvik
*Assistant Examiner* — Whitney T Moore
(74) *Attorney, Agent, or Firm* — Joseph Petrokaitis

(57) ABSTRACT

A CMOS structure includes a v-shape surface in an nMOSFET region. The v-shape surface has an orientation in a (100) plane and extends into a Si layer in the nMOSFET region. The nMOSFET gate dielectric layer is a high-k material, such as Hf02. The nMOSFET has a metal gate layer, such as Ta. Poly-Si is deposited on top of the metal gate layer.

16 Claims, 10 Drawing Sheets

STRUCTURE AND METHOD FOR MANUFACTURING DEVICE WITH A V-SHAPE CHANNEL NMOSFET

CROSS-REFERENCE TO RELATED APPLICATION

This application is a continuation of currently co-pending U.S. patent application Ser. No. 12/488,783, filed on Jun. 22, 2009, the subject matter of which is incorporated herein by reference in its entirety.

BACKGROUND OF THE INVENTION

The present invention relates to a semiconductor device and method of manufacturing the same and, more particularly, to a structure and method for manufacturing a complementary metal-oxide-semiconductor (CMOS) with a V-shape channel nMOSFET.

Scaling of gate length of metal-oxide-semiconductor field-effect transistors (MOSFETs) can enhance performance. However, it increases stand-by power of very-large-scale integration (VLSI). Therefore, power consumption is a serious problem for VLSI. MOSFETs with long channel gate length have low stand-by power, but performance is relatively poor.

Increasing of mobility of electrons or holes can enhance performance without increasing stand-by power. Mobility of electrons or holes depends on surface crystalline orientations in silicon. In a MOSFET with an n-type channel (nMOSFET), electrons are responsible for conduction. In a MOSFET with a p-type channel (pMOSFET), holes are responsible for conduction. It is desirable to build an nMOSFET in a (100) surface and pMOSFET in a (110) surface in order to obtain the maximum electron mobility for the nMOSFET and the maximum hole mobility for the pMOSFET.

However, it is difficult and/or expensive to manufacture substrates that have hybrid surface crystalline orientations.

SUMMARY OF THE INVENTION

In a first aspect of the invention, a method of forming a device includes forming an oxide layer on top of a CMOS structure having an nMOSFET region and a pMOSFET region in a (110) surface, wherein a top of the oxide layer is co-planar with a top of the pMOSFET region. The method includes patterning a hardmask nitride to cover the oxide layer above the pMOSFET region. The method includes removing poly-Si in the nMOSFET region. The method includes removing gate oxide in the nMOSFET region to expose a Si layer in a channel area of the nMOSFET region. The method includes removing Si to form a cavity in the channel area of the nMOSFET region. The method includes performing selective Si epitaxial growth in the cavity to form a V-shape surface having an orientation in a (100) plane. The method includes removing the hardmask nitride above the pMOSFET region. The method includes depositing an nMOSFET gate dielectric layer. The method includes depositing an nMOSFET metal gate layer, such that a top surface of the nMOSFET metal gate layer is below the top of the oxide layer. The method includes depositing poly-Si on top of the nMOSFET metal gate layer, such that a top surface of the Poly-Si is below the top of the oxide layer. The method further includes removing a portion of the nMOSFET gate dielectric layer, such that a top surface of the nMOSFET gate dielectric layer is below the top surface of the oxide layer. The method also includes removing the oxide layer.

In another aspect of the invention, a method of forming a device includes depositing an oxide layer on top of a CMOS structure having an nMOSFET region and a pMOSFET region in a (110) surface. The method includes performing a chemical mechanical polish (CMP) of the oxide layer. The method includes patterning a hardmask nitride to cover the oxide layer above the pMOSFET region. The method includes performing a first reactive ion etching (RIE) to remove poly-Si in the nMOSFET region. The method includes performing a second RIE to remove gate oxide in the nMOSFET region and to expose a Si layer in a channel area of the nMOSFET region. The method includes performing a third RIE to remove Si to form a cavity in the channel area of the nMOSFET region, wherein the cavity has a depth less than the thickness of the Si layer. The method includes performing selective Si epitaxial growth in the cavity to form a V-shape surface having an orientation in a (100) plane. The method includes removing the hardmask nitride above the pMOSFET region. The method includes depositing an nMOSFET gate dielectric layer. The method includes depositing an nMOSFET metal gate layer. The method includes etching back a portion of the nMOSFET metal gate layer, such that a top surface of the nMOSFET metal gate layer is below the top of the oxide layer. The method includes depositing in-situ doped poly-Si on top of the nMOSFET metal gate layer. The method includes etching back a portion the in-situ doped poly-Si, such that a top surface of the in-situ doped poly-Si is below the top of the oxide layer. The method further includes etching back a portion of the nMOSFET gate dielectric layer, such that a top surface of the nMOSFET gate dielectric layer is below the top of the oxide layer. The method also includes etching back the oxide layer.

In a further aspect of the invention, a device includes a CMOS structure having an nMOSFET region and a pMOSFET region. The device includes a V-shape surface in the nMOSFET region, the V-shape surface having an orientation in a (100) plane and extending into a Si layer in the nMOSFET region. The device includes a gate dielectric layer in the V-shape surface. The device further includes a metal gate layer on top of the gate dielectric layer. The device also includes poly-Si on top of the metal gate layer.

BRIEF DESCRIPTION OF THE DRAWINGS

The present invention is described in the detailed description below, in reference to the accompanying drawings that depict non-limiting examples of exemplary embodiments of the present invention.

DETAILED DESCRIPTION OF THE INVENTION

The invention relates to a semiconductor device and method of manufacturing the same and, more particularly, to a structure and method for manufacturing a device with a V-shape channel nMOSFET.

Figure 1:
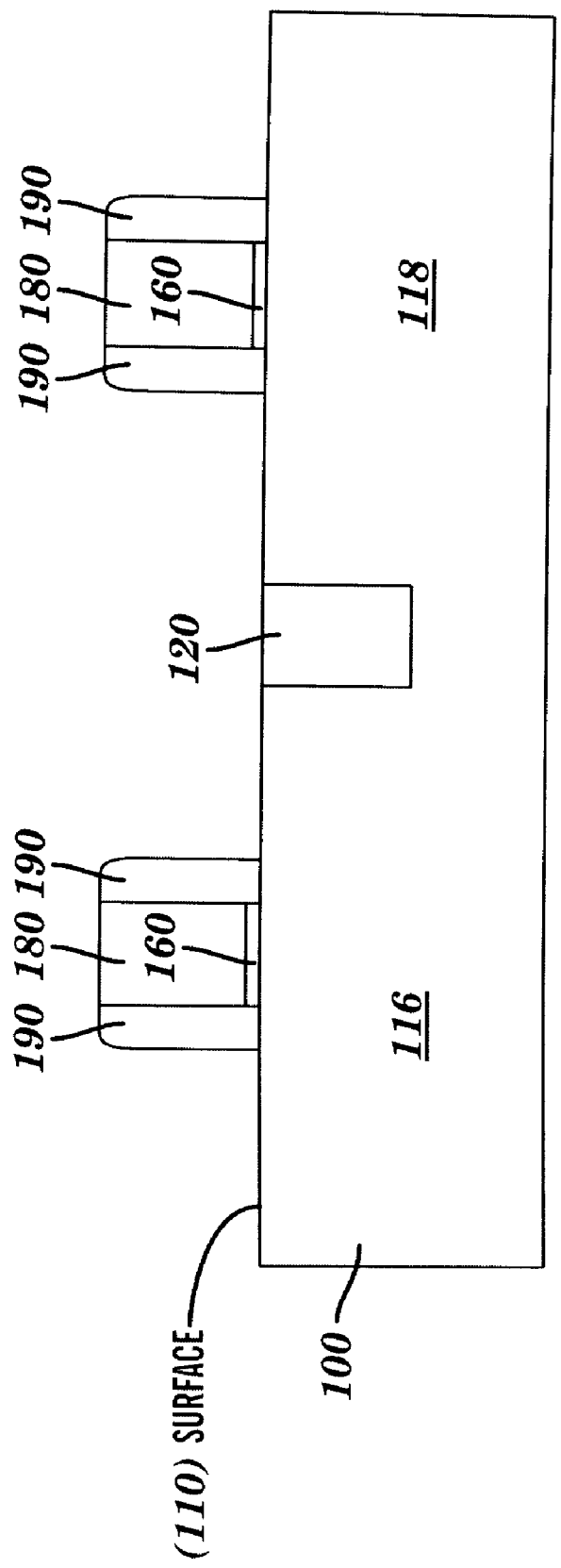
FIG. 1 shows a starting structure and processing steps in accordance with an embodiment of the invention.

FIG. 1 shows a starting structure and processing steps in accordance with an embodiment of the invention. Preferably, a CMOS structure is built with conventional process flow on a (110) silicon surface on Si layer 100. All necessary implantation have been finished, such as halo, extension and source/drain. The structure includes an nMOSFET region 116 and a pMOSFET region 118. Nitride spacers 190 are formed. Gate oxide 160 is deposited on top of a Si layer 100. Poly-Si 180 is deposited on gate oxide 160. A shallow trench isolation region 120 is formed in Si layer 100. In order to adjust the performance ratio between the nMOSFET and pMOSFET, the gate length of the nMOSFET may be different from the pMOSFET.

Figure 2:
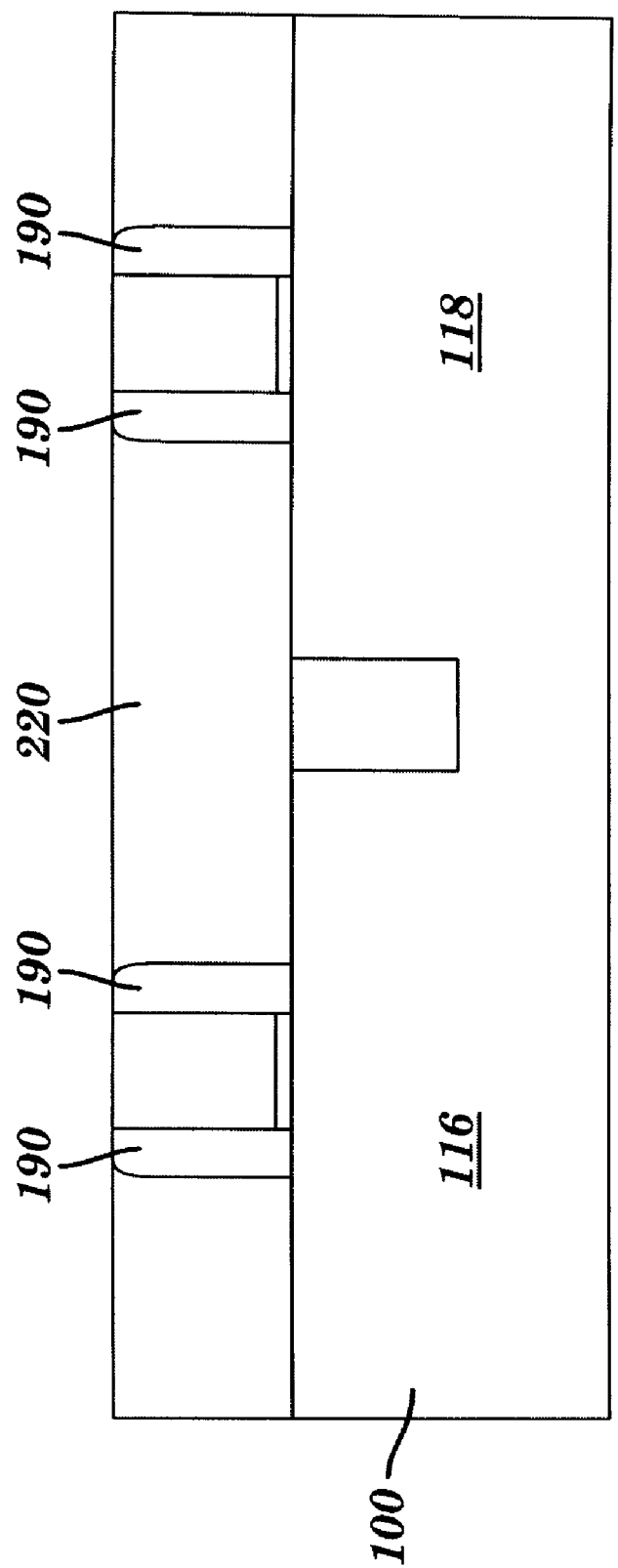
FIGS. 2-9 show processing steps and intermediate structures in accordance with an embodiment of the invention.

Referring to FIG. 2, an oxide layer 220 is deposited on top of the nitride spacer 190 and Si layer 100. A top of the oxide layer 220 is co-planar with a top of the pMOSFET region. A chemical mechanical polish (CMP) of oxide layer 220 may be performed on the top of nitride spacer 190 to make it co-planar.

Figure 3:
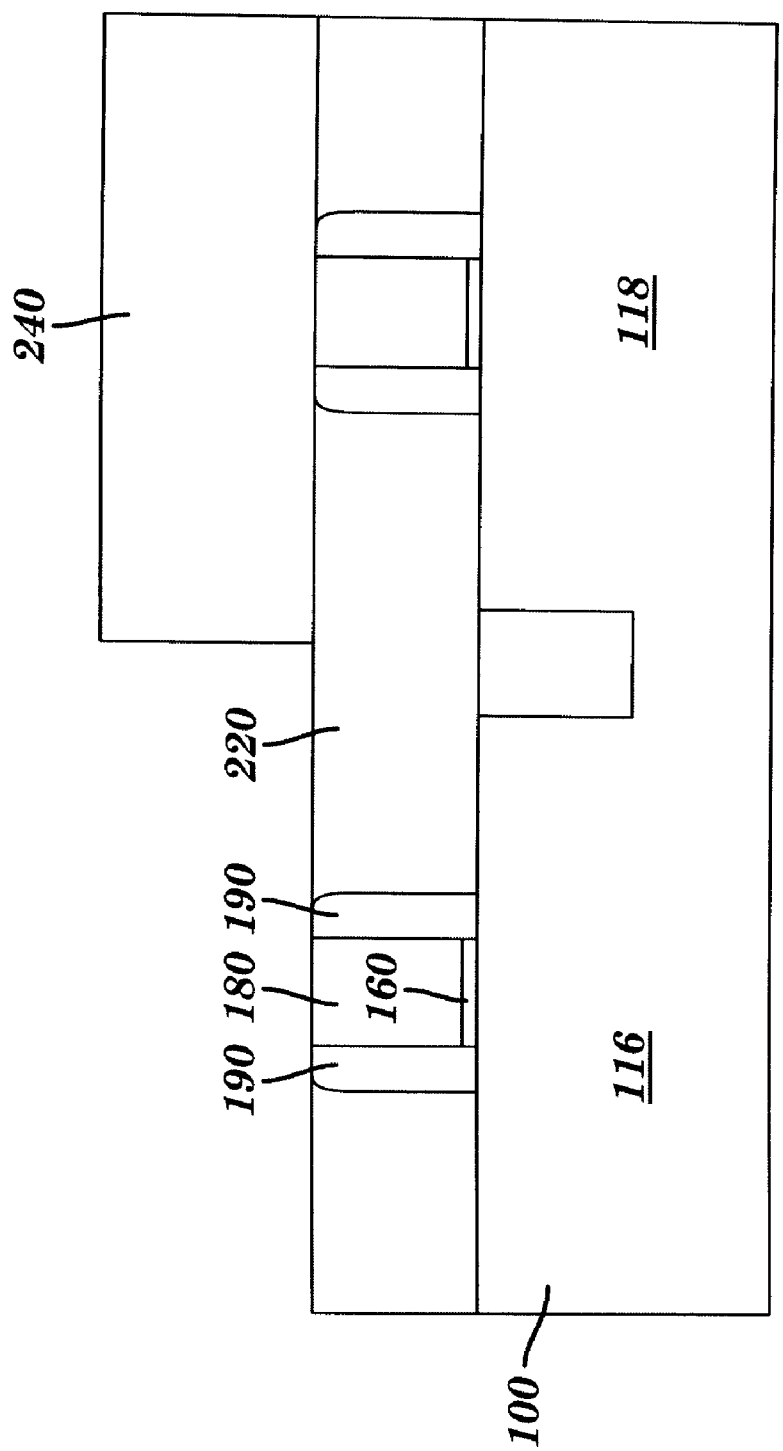
Figure 4:
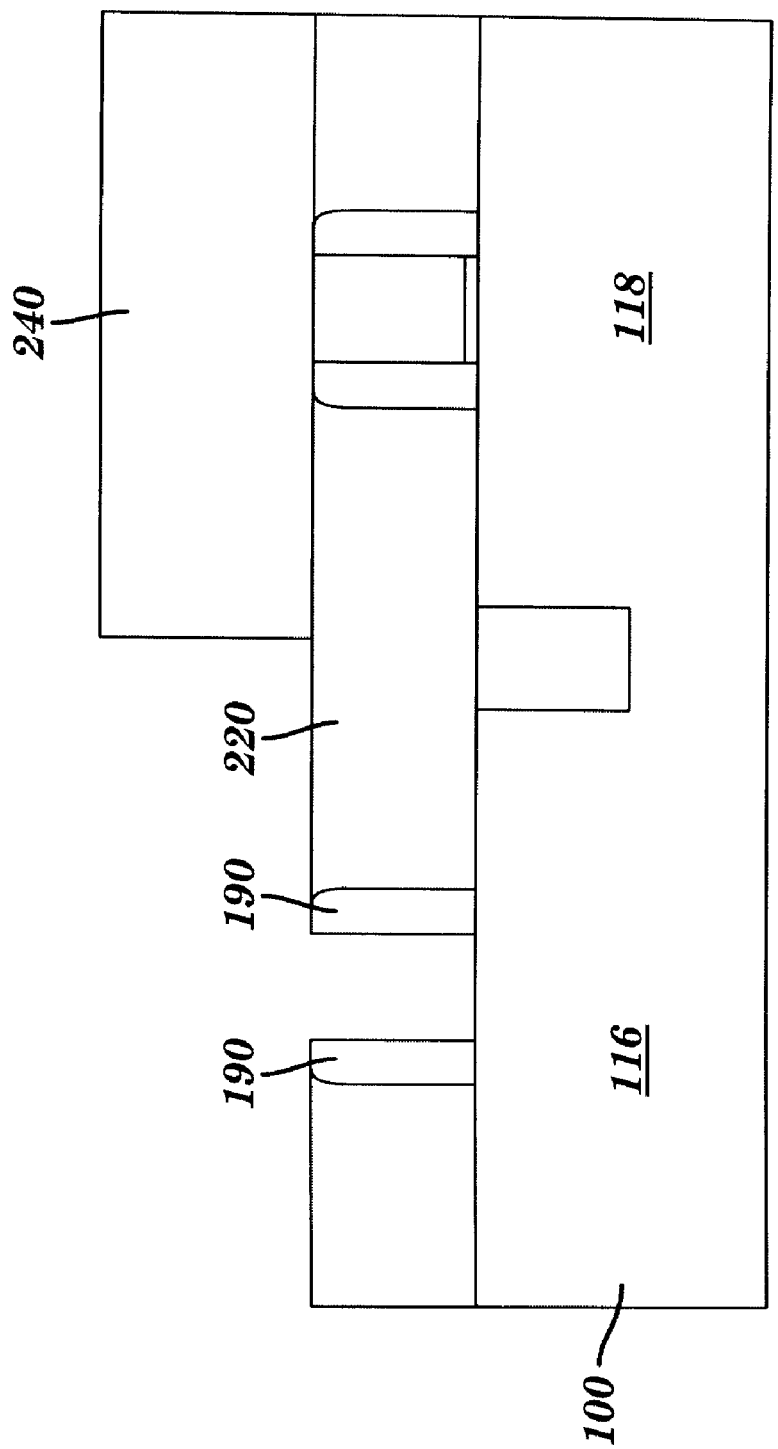

Referring to FIGS. 3 and 4, a hardmask nitride 240 is patterned to cover the pMOSFET region 118. Poly-Si 180 is removed in the nMOSFET region 116. Reactive ion etching (RIE) may be performed to remove poly-Si 180. Gate oxide 160 is removed in the nMOSFET region 116 and to expose an Si layer 100 in a channel area of the nMOSFET region 116. RIE may also be performed to remove gate oxide 160 to expose Si layer 100 in the channel area of nMOSFET region 116.

Figure 5:
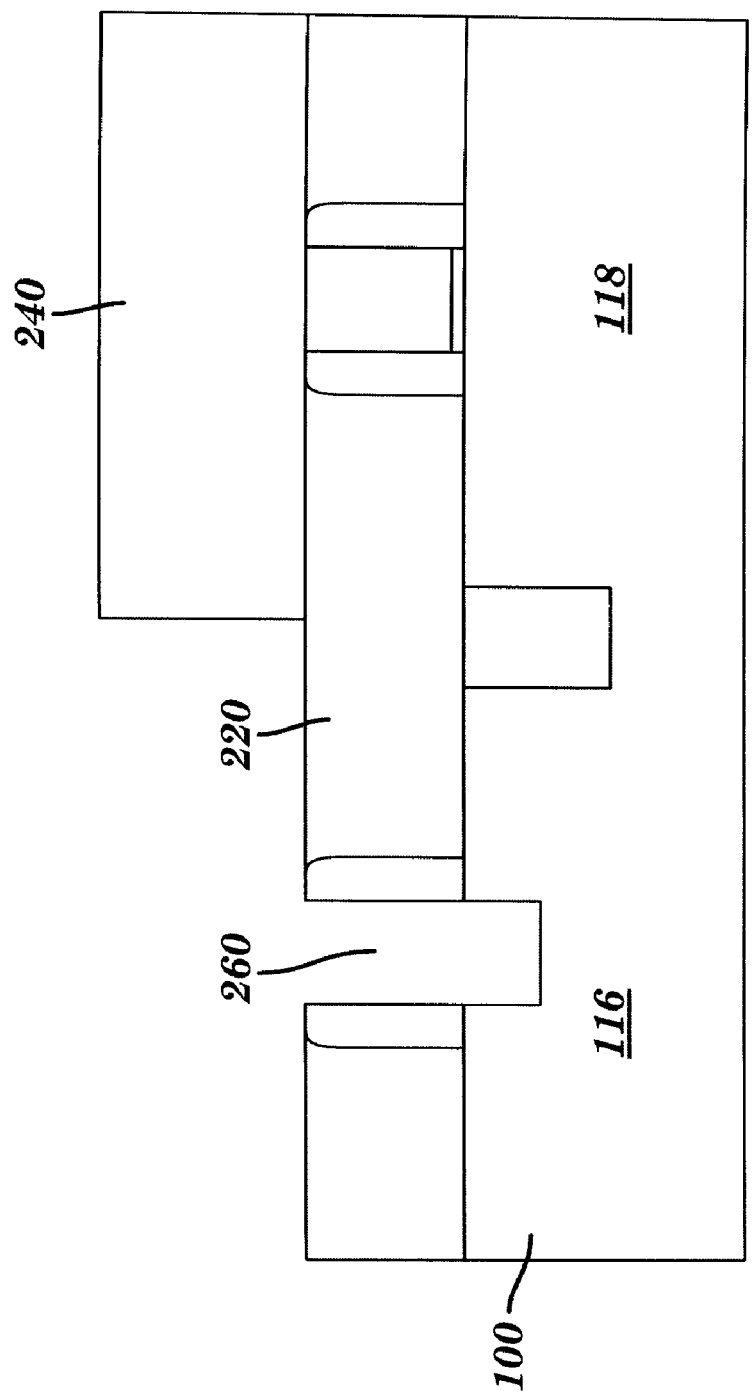

Referring to FIG. 5, Si is removed in the nMOSFET region 116 to form a cavity 260 in the nMOSFET channel area. RIE may also be performed to remove Si to form the cavity in the nMOSFET channel area. Cavity 260 has a depth less than the thickness of Si layer 100.

Figure 6:
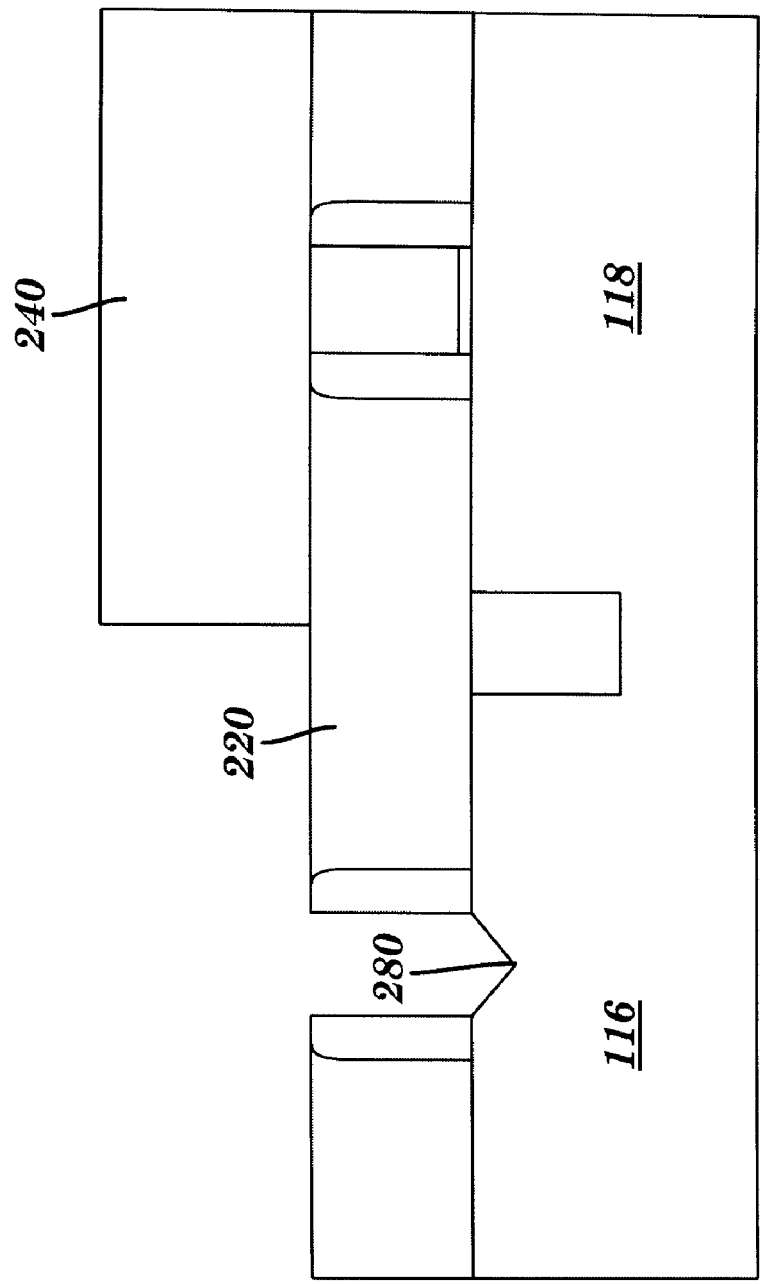

Referring to FIG. 6, selective Si epitaxial growth is performed in the cavity to form a V-shape surface 280. V-shape surface 280 has an orientation in a (100) plane.

Figure 7:
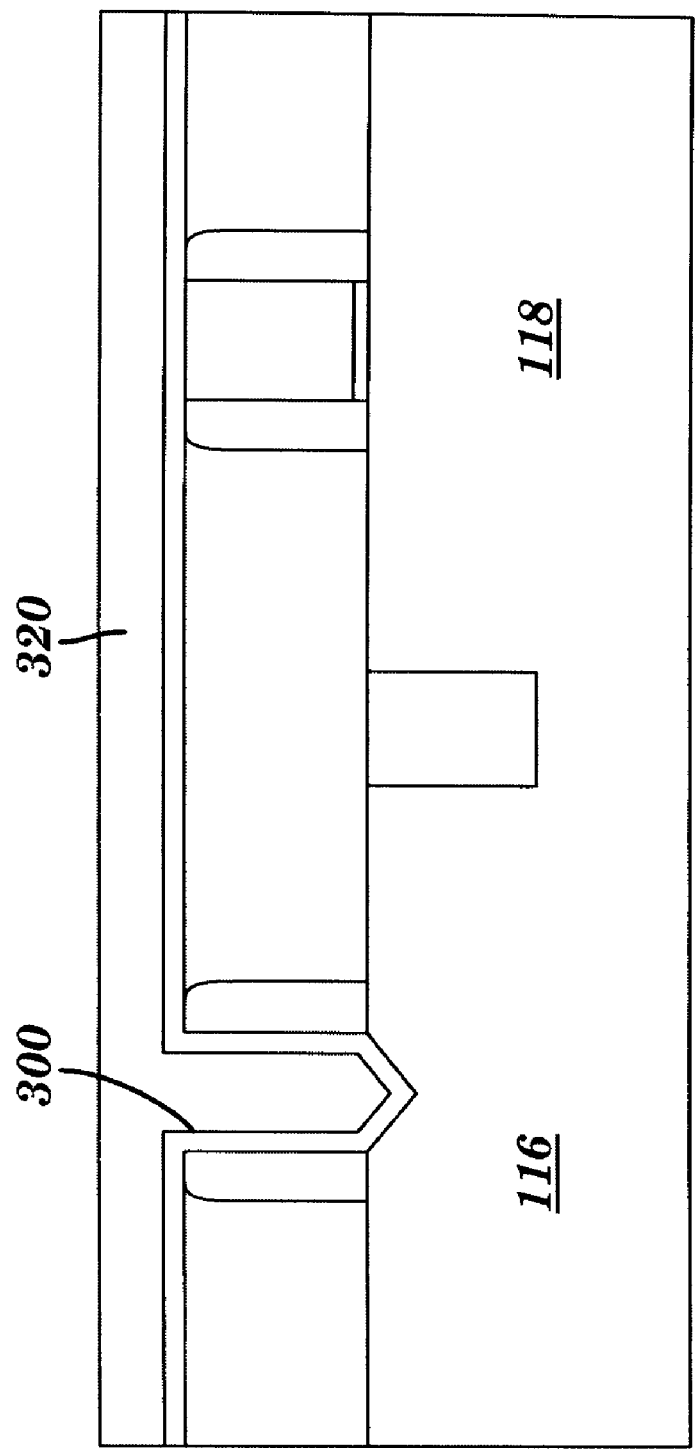

Referring to FIG. 7, hardmask nitride 240 is removed using a conventional process. An nMOSFET gate dielectric layer 300 is deposited. The nMOSFET gate dielectric layer 300 may be a high-k material such as, for example, HfO2, ZrO$_2$, Al$_2$O$_3$, TiO$_2$, La$_2$O$_3$, SrTiO$_3$ or LaAlO$_3$. An nMOSFET metal gate layer 320 is also deposited. The nMOSFET metal gate layer may include, for example, TaN, TiN, TiAlN or WN.

Figure 8:
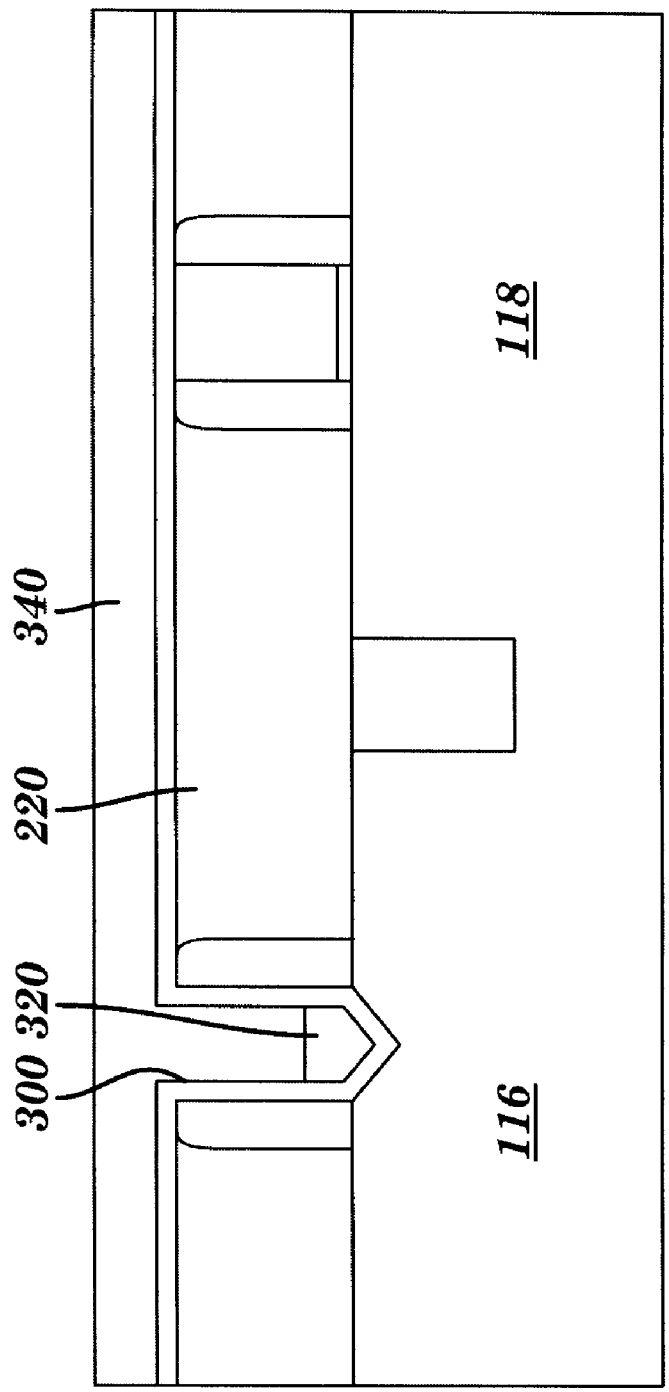

Referring to FIG. 8, the nMOSFET metal gate layer 320 is partially removed.

The nMOSFET metal gate layer 320 may be etched back using conventional processes such that a top surface of nMOSFET metal gate layer 320 is below a top of oxide layer 220. Poly-Si 340 deposited on top of nMOSFET metal gate layer 320. Poly-Si 340 may be in-situ doped. Specifically, poly-Si 340 may be doped with P.

Figure 9:
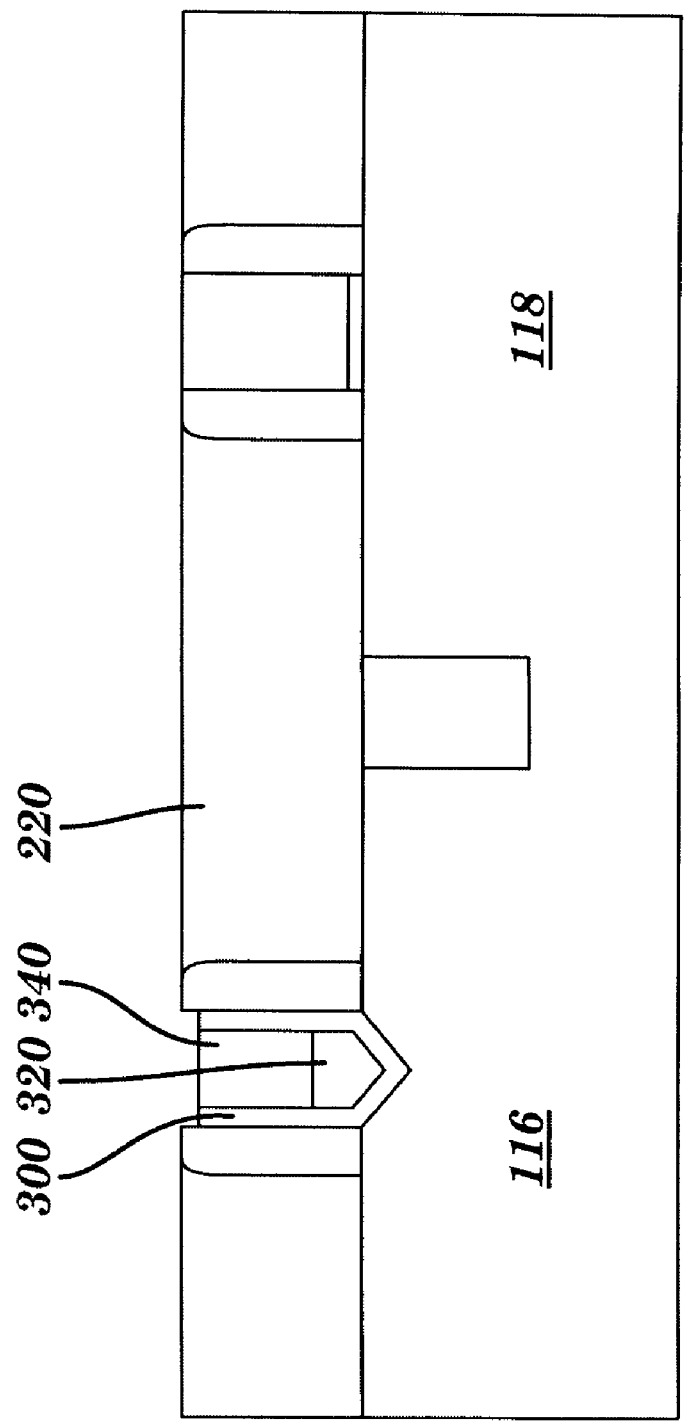

Referring to FIG. 9, a portion of poly-Si 340 is partially removed. A portion of nMOSFET gate dielectric layer 300 is removed. Portions of poly-Si 340 and nMOSFET gate dielectric layer 300 may be etched back using conventional processes such that a top surface of nMOSFET gate dielectric layer 300 and a top surface of poly-Si 340 are below a top of oxide layer 220.

Figure 10:
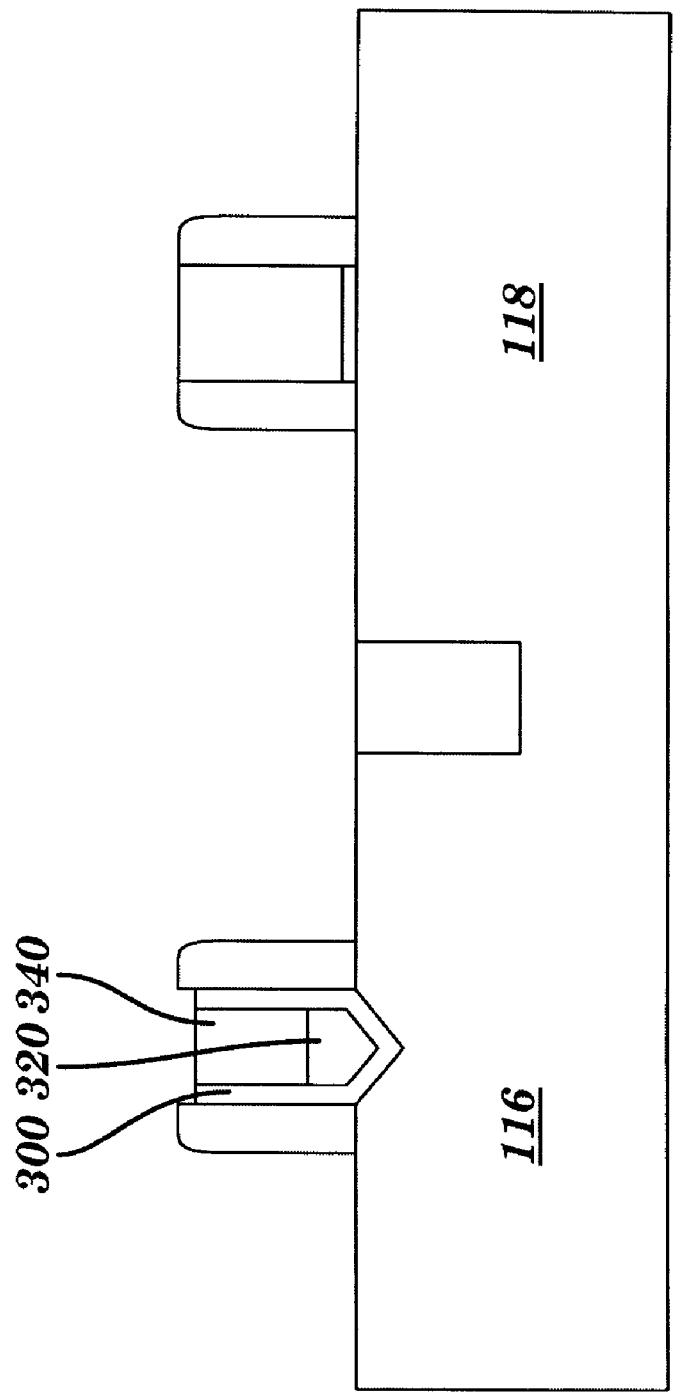
FIG. 10 shows processing steps and a final structure in accordance with an embodiment of the invention.

FIG. 10 shows processing steps and a final structure in accordance with an embodiment of the invention. Oxide layer 220 is removed. Oxide layer 220 may be etched back using conventional processes. After this step, one can follow conventional process steps to finish the CMOS device (i.e., ion implantation, source/drain activation anneal, silicide formation and metal contacts). In this CMOS, nMOSFET 116 is built on a (100) surface and pMOSFET 118 on a (110) surface.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of forming a device, comprising:
    forming an oxide layer on top of a CMOS structure having an nMOSFET region and a pMOSFET region in a (110) surface, wherein a top of the oxide layer is co-planar with a top of the pMOSFET region;
    patterning a hardmask nitride to cover the oxide layer above the pMOSFET region;
    removing poly-Si in the nMOSFET region;
    removing gate oxide in the nMOSFET region to expose a Si layer in a channel area of the nMOSFET region;
    removing Si to form a cavity in the channel area of the nMOSFET region;
    performing selective Si epitaxial growth in the cavity to form a V-shape surface having an orientation in a (100) plane;
    removing the hardmask nitride above the pMOSFET region;
    depositing an nMOSFET gate dielectric layer;
    depositing an nMOSFET metal gate layer, such that a top surface of the nMOSFET metal gate layer is below the top of the oxide layer;
    depositing poly-Si on top of the nMOSFET metal gate layer, such that a top surface of the Poly-Si is below the top of the oxide layer;
    removing a portion of the nMOSFET gate dielectric layer, such that a top surface of the nMOSFET gate dielectric layer is below the top surface of the oxide layer; and
    removing the oxide layer.

2. A method according to claim 1, wherein the forming the oxide layer step comprises performing a chemical mechanical polish (CMP) of the oxide layer.

3. A method according to claim 1, wherein the removing the poly-Si step comprises performing a first reactive ion etching (RIE).

4. A method according to claim 1, wherein the removing the gate oxide step comprises performing a second RIE.

5. A method according to claim 1, wherein the removing the Si step comprises performing a third RIE.

6. A method according to claim 1, wherein the nMOSFET gate dielectric layer is a high-k material.

7. A method according to claim 6, wherein the high-k material is selected from the group consisting of: HfO2, ZrO$_2$, Al$_2$O$_3$, TiO$_2$, La$_2$O$_3$, SrTiO$_3$ and LaAlO$_3$.

8. A method according to claim 1, wherein the nMOSFET metal gate layer is selected from the group consisting of: TaN, TiN, TiAlN and WN.

9. A method according to claim 1, wherein the poly-Si is in-situ doped with P.

10. A method according to claim 1, wherein the removing a portion of the nMOSFET gate dielectric layer step comprises etching back the gate dielectric layer.

11. A method according to claim 1, wherein the removing the oxide layer step comprises etching back the oxide layer.

12. A method according to claim 1, wherein the cavity has a depth less than the thickness of the Si layer.

13. A method of forming a device, comprising:
   depositing an oxide layer on top of a CMOS structure having an nMOSFET region and a pMOSFET region in a (110) surface;
   performing a chemical mechanical polish (CMP) of the oxide layer;
   patterning a hardmask nitride to cover the oxide layer above the pMOSFET region;
   performing a first reactive ion etching (RIE) to remove poly-Si in the nMOSFET region;
   performing a second RIE to remove gate oxide in the nMOSFET region and to expose a Si layer in a channel area of the nMOSFET region;
   performing a third RIE to remove Si to form a cavity in the channel area of the nMOSFET region, wherein the cavity has a depth less than the thickness of the Si layer;
   performing selective Si epitaxial growth in the cavity to form a V-shape surface having an orientation in a (100) plane;
   removing the hardmask nitride above the pMOSFET region;
   depositing an nMOSFET gate dielectric layer;
   depositing an nMOSFET metal gate layer;
   etching back a portion of the nMOSFET metal gate layer, such that a top surface of the nMOSFET metal gate layer is below the top of the oxide layer;
   depositing in-situ doped poly-Si on top of the nMOSFET metal gate layer;
   etching back a portion the in-situ doped poly-Si, such that a top surface of the in-situ doped poly-Si is below the top of the oxide layer;
   etching back a portion of the nMOSFET gate dielectric layer, such that a top surface of the nMOSFET gate dielectric layer is below the top of the oxide layer; and
   etching back the oxide layer.

14. A method according to claim 13, wherein the nMOSFET gate dielectric layer is a high-k material.

15. A method according to claim 14, wherein the high-k material is selected from the group consisting of: HfO2, $ZrO_2$, $Al_2O_3$, $TiO_2$, $La_2O_3$, $SrTiO_3$ and $LaAlO_3$.

16. A method according to claim 13, wherein the nMOSFET metal gate layer is selected from the group consisting of: TaN, TiN, TiAlN and WN.

* * * * *